(12) United States Patent
Pecanins Martinez et al.

(10) Patent No.: US 12,126,365 B2
(45) Date of Patent: Oct. 22, 2024

(54) CONTINUOUS-TIME DELTA-SIGMA MODULATOR, INTEGRATED CIRCUIT AND METHOD THEREFOR

(71) Applicant: NXP B.V., Eindhoven (NL)

(72) Inventors: Victor Pecanins Martinez, Delft (NL); Robert van Veldhoven, Valkenswaard (NL)

(73) Assignee: NXP B.V., Eindhoven (NL)

( * ) Notice: Subject to any disclaimer, the term of this patent is extended or adjusted under 35 U.S.C. 154(b) by 198 days.

(21) Appl. No.: 18/052,425

(22) Filed: Nov. 3, 2022

(65) Prior Publication Data
US 2024/0030934 A1  Jan. 25, 2024

(30) Foreign Application Priority Data
Jul. 22, 2022  (EP) .................................... 22186503

(51) Int. Cl.
*H03M 3/00*  (2006.01)
(52) U.S. Cl.
CPC ........... *H03M 3/464* (2013.01); *H03M 3/422* (2013.01); *H03M 3/454* (2013.01)
(58) Field of Classification Search
CPC .... H03M 3/464; H03M 1/1245; H03M 3/422; H03M 3/454
USPC ........................................ 341/143, 155, 144
See application file for complete search history.

(56) References Cited

U.S. PATENT DOCUMENTS

| | | | |
|---|---|---|---|
| 6,930,624 B2 | 8/2005 | Hezar et al. | |
| 7,239,202 B1* | 7/2007 | Aram | H03F 3/45475 330/99 |
| 7,423,566 B2 | 9/2008 | Chen | |
| 10,931,300 B1 | 2/2021 | Coban et al. | |
| 2009/0224954 A1 | 9/2009 | Balachandran | |

(Continued)

OTHER PUBLICATIONS 10.9.1 Loop-Filter Nonlinearities in Continuous-Time Delta-Sigma Modulators, "Circuit Techniques to Improve Loop-Filter Linearity," p. 345.

(Continued)

*Primary Examiner* — Peguy Jean Pierre

(57) ABSTRACT

A continuous-time delta-sigma modulator, CTDSM (400, 500, 700, 800) is described that comprises: an operational transconductance amplifier, OTA, (406, 506, 706, 806) having an input port (404, 504, 719, 739, 819, 839) configured to receive an analog input signal and an output port (408, 508, 707, 708, 807, 808); an input low pass filter network comprising at least one input resistor, R1, (402, 502, 702, 722, 802, 822) at least one first shunt capacitor, C1, (403, 503, 703, 803) and at least one feedback resistor, Rdac (410, 510, 710, 810, 730, 830) connected to the input port of the OTA; an output filter network comprising a shunt second resistor, R2, (415, 515, 715, 815) in parallel to a second shunt capacitor, C2, (414, 514, 714, 814), and coupled to the output port (408, 508, 707, 708, 807, 808) of the OTA; a quantizer (413, 513, 713, 813) connected to the output filter network and having at least one output connected to the input port of the OTA via the at least one feedback resistor, Rdac; and wherein the input and output port of the OTA connected by a third feedforward-feedback capacitor, C3, (409, 509, 709, 729, 809, 829) arranged to provide a positive feedback around the OTA.

20 Claims, 8 Drawing Sheets

(56) References Cited

U.S. PATENT DOCUMENTS

2017/0162275 A1* 6/2017 Gao .................. G01R 19/2509
2022/0345150 A1* 10/2022 Modaffari ............. H03M 3/454
2022/0407539 A1* 12/2022 Gerfers ............... H03F 3/45183

OTHER PUBLICATIONS

Benabes et al.: "Passive Sigma-Delta converters design," EEE Instrumentation and Measurement, Technology Conference, Anchorage, AK, USA, 2 May 1-23, 2002, pp. 469-474.
Chae et al.: "A 12 mW Low Power Continuous-Time Bandpass ΔΣ Modulator With 58 dB SNDR and 24 MHz Bandwidth at 200 MHz if," IEEE Journal of Solid-State Circuits, vol. 49, No. 2, Feb. 2014, pp. 405-415.
Jang et al.: "A 134μW 24kHz-BW 103.5dB-DR Ct ΔΣ Modulator with Chopped Negative-R and Tri-Level FIR DAC," IEEE, 2020 IEEE International Solid-State Circuits Conference—(ISSCC), Feb. 16-20, 2020, San Francisco, CA, USA, pp. 1-3.
Jang et al.: "Analysis and Design of Low-Power Continuous-Time Delta-Sigma Modulator Using Negative-R Assisted Integrator," IEEE, Journal of Solid-State Circuits, vol. 54, No. 1, Jan. 2019, pp. 277-287.
Li et al.: "Improving Power Efficiency for Active-RC Delta-Sigma Modulators Using a Passive-RC Low-Pass Filter in the Feedback," IEEE, Transactions on Circuits and Systems-II: Express Briefs, vol. 65, No. 11, Nov. 2018, pp. 1559-1563.
Melo et al.: "Continuous-Time Delta-Sigma Modulators Based on Passive RC Integrators," IEEE, Transactions on Circuits and Systems-I: Regular Papers, vol. 65, No. 11, Nov. 2018, pp. 3662-3674.
Mukherjee et al.: "Design Tradeoffs for a CT-16 Adc With Hybrid Active—Passive Filter and FIR DAC in 40-nm CMOS," IEEE, Solid-State Circuits Letters, vol. 3, 2020, pp. 214-217.
Straayer et al.: "A 12-Bit, 10-MHz Bandwidth, Continuous-Time ΣΔ ADC With a 5-Bit, 950-MS/s VCO-Based Quantizer," IEEE, Journal of Solid-State Circuits, vol. 43, No. 4, Apr. 2008, pp. 805-814.

\* cited by examiner

CONTINUOUS-TIME DELTA-SIGMA MODULATOR, INTEGRATED CIRCUIT AND METHOD THEREFOR

CROSS-REFERENCE TO RELATED APPLICATIONS

This application claims the priority under 35 U.S.C. § 119 of European Patent application no. 22186503.3, filed on 22 Jul. 2022, the contents of which are incorporated by reference herein.

FIELD OF THE INVENTION

The field of this invention relates to a continuous-time delta-sigma modulator (CTDSM), an integrated circuit and method therefor. In particular, the field of this invention relates to improving a power efficiency in CTDSMs.

BACKGROUND OF THE INVENTION

Analog to digital converters (ADCs) with signal bandwidths (BW) between 20 kHz and 10 MHz and a signal to noise and distortion ratio (SNDR) between 70 and 100 dB are needed for many applications such as: audio, Bluetooth™, mobile phones, laptops, tablets, wireless earbuds, hearing aids, automotive, general-purpose data acquisition, etc. In recent years, ADCs based on the Continuous-Time Delta Sigma Modulator (CTDSM) architecture have demonstrated an ability of achieving the range of specifications associated with these applications with a low power consumption, which makes it ideal for portable electronics. In a context of the present invention, a definition of low-power is approximately based on the known Schreier Figure of Merit: $FOM_{schreier} > 180$ dB, within a margin of say 10%, as meaning 'low power'.

A CTDSM is a feedback loop containing a continuous-time (CT) loop filter, a clocked quantizer (from now on referred to as simply "quantizer"), and the feedback DAC(s). The function of the quantizer is sampling and quantization. The quantizer input signal is continuous in a time domain and continuous in a voltage domain, i.e., a continuous-time, continuous-value (analog signal). The quantizer output signal is discrete in the time domain and discrete in the voltage domain, i.e., discrete-time discrete-value (digital signal). The function of the main feedback DAC is converting the digital signal to analog signal.

The function of the CT loop filter is to amplify and filter the difference between the input signal and the feedback signal from the DAC. Due to the principle of negative feedback, the high-gain provided by the CT loop filter causes the DAC signal to track the input signal, as long as the frequency of the signal is relatively small compared to the sampling frequency.

The quantization artifacts introduced by the quantizer are pushed to higher frequencies. This is known as "noise shaping". Hence, if the sampling frequency is much higher than twice the signal bandwidth (oversampling principle), it is possible to obtain an accurate representation of the input. This is done by applying a digital filter (sometimes referred to as a "decimation filter") on the bitstream at the output of the quantizer, that discards the high-frequency components in the digital domain. This enables a circuit designer to be able to use the CTDSM as an ADC. The CT loop filter is typically a low-pass filter.

Referring first to FIG. 1, a block diagram of a known continuous-time delta-sigma modulator (CTDSM) 100 is illustrated. The input analog continuous time signal 110 is fed via input resistor 101 to the input 109 of operational transconductance amplifier (OTA) 103. In FIG. 1, an OTA 103 with a single input 109 and a single output 107 are illustrated. This means that a positive voltage applied at the input of the OTA with respect to GND, will result in a positive current being 'sinked' by the output of the OTA 103. The output 107 of the OTA 103 is fed back to its input 109 via capacitor 102, the OTA output 107 also being processed by further filter components 104, before being input 108 to a subsequent digitising circuit, e.g., quantizer 105 to generate the CTDSM output 111. The CTDSM output 111 is inverted, e.g., multiplied by a gain block with gain '−1' 106 and fed back to the OTA input 109 via a series connected resistor 112. In combination, the input resistor 101 and DAC resistor 112, the capacitor 102 and the OTA 103 operating in negative feedback, form an active integrator stage of a loop filter.

Referring to FIG. 2, a block diagram of a known CTDSM input stage 200, referred to in the literature as 'Active-RC Integrator', is illustrated. The analog input signal 201 is fed via a first input resistor 203 to an inverting input 205 of an OTA 208. A digitised signal 202 is also fed via a second input resistor 204 to the inverting input 205 of the OTA 208. The OTA output signal 207 is fed back to its inverting input 205 via capacitor 206. The non-inverting input 209 of the OTA 208 is tied to ground potential. The maximum instantaneous current that needs to be provided by the OTA is a combination of the analog input signal 210 and digitised input signal 211.

A well-known problem with this implementation, is that due to the quantisation noise (whose power is mainly concentrated at high frequencies, due to noise shaping) the OTA 208 should provide high current peaks at its output 207. In traditional CTDSM, the problem of providing such current peaks with sufficient linearity is solved by increasing the current available to the first OTA. Hence, in order to deliver these high current peaks with sufficient linearity, the OTA needs a high bias current, which undesirably increases power consumption.

Referring now to FIG. 3, a block diagram of an alternative known CTDSM input stage 300 is illustrated. The alternative known CTDSM input stage 300 has a continuous time input 301 and a digitised input signal 304 connected via resistors 302 and 305 respectively to the inverting input 311 of OTA 307. The inverting input 311 is also connected via capacitor 306 to ground potential whilst non-inverting input 309 is connected directly to ground potential. In this design the active OTA-RC integrator shown in FIG. 2 is replaced by a passive resistor-capacitor (RC) low-pass filter formed by the resistors 302, 305 and capacitor 306 components, followed by an OTA 307 without feedback. Advantageously, the RC filter attenuates the high-frequency components of the quantizer's quantization noise, without requiring additional power and being inherently linear. As further illustrated in FIG. 3, for example when presented with the input voltages of the analog input signal 210 and digitised input signal 211 of FIG. 2, the OTA 307 has to process a combined voltage signal 312 with low swing, which reduces the swing of the OTA output current 212 of the circuit of FIG. 2. Hence, it requires less current and much less power to achieve the desired linearity. Passive RC DSM circuits of this kind can be found in, for example: 'Continuous-Time Delta-Sigma Modulators Based on Passive RC Integrators,' authored by J. L. A. de Melo, N. Paulino and J. Goes, and published in *IEEE Transactions on Circuits and Systems I: Regular Papers*, vol. 65, no. 11, pp. 3662-3674, November 2018; and 'Design Tradeoffs for a CT-ΔΣ ADC With Hybrid Active-Passive Filter and FIR DAC in 40-nm CMOS,' authored by A. Mukherjee, X. Tang, C.-K. Hsu, and N. Sun, and published in *IEEE Solid-State Circuits Letters*, vol. 3, pp. 214-217, 2020.

In any continuous-time delta-sigma modulator (CTDSM), the resolution is limited by the thermal noise introduced by the input and feedback resistors (e.g., input resistors 302, 305 in FIG. 3). Thermal noise power is directly proportional to resistance; hence for low thermal noise in a high-resolution converter, the values of these resistances should be kept as small as possible. Simultaneously, the quantization noise also needs to be reduced in order to achieve high resolution. This implies that the pole formed by the low pass filter components of input resistors 302, 305, and capacitor 306 in FIG. 3 should be at low frequency. Because the input resistances 302, 305 cannot be increased, and because the pole is defined by the product of the component values R and C, which should be maximised, this can only be achieved by increasing C. The problem then arises that often the physical size of the capacitor (C) is required to be so large that it is not practical to implement the architecture of FIG. 3 in integrated circuits (ICs). In practice, for a high-resolution (>100 dB SNDR) and low-bandwidth (20 kHz) ADC, the frequency of the first RC pole cannot be made low enough to lie within the signal bandwidth, using the architecture from FIG. 3.

In FIG. 2 and FIG. 3, an OTA 208, 307 with a differential-input and a single-ended output are illustrated. This means that a positive voltage applied to the noninverting (+) input with respect to the inverting (−) input of the OTA 208, 307, will result in a positive current being 'sourced' by the output of the OTA 208, 307. In FIG. 2 and FIG. 3, the non-inverting (+) input 209, 309 of the OTA 208, 307 is tied to GND, thereby being functionally equivalent to the same notation used in FIG. 1.

A second-order CTDSM, would ideally have 40 dB/decade noise shaping at low-frequencies. However, due to the limitation of the size of the capacitor 306, the R*C pole frequency is generally higher than the signal bandwidth, which results in a quantization noise spectrum that grows by, say, 20 dB/decade in the signal bandwidth, and then, say, 40 dB/decade for frequencies higher than the R*C pole resulting in a sub-optimal noise shaping.

One alternative to improve resolution is to increase the over-sampling ratio (OSR), which has the effect of spreading the noise over a broader frequency range and, hence, above the frequencies of interest. However, this spreading of noise again increases the power consumption of the digital circuitry. Alternatively, it is possible to increase the order of the loop filter, but this increases circuit complexity and results in further trade-offs caused by the reduced robustness of a design due to compromised loop stability.

Thus far, delta-sigma-modulators with a passive input stage have been reported, but none of the designs have an optimal NTF. Thus, it is desirable to design a delta-sigma-modulator with an optimal NTF, as an optimal NTF provides a minimum quantization noise for a given OSR, taking into account a desire to incorporate smaller capacitors to limit circuit physical size. Furthermore, in 'state of the art' designs, the overall power consumption of a CTDSM is dominated by the power consumption of the amplifiers and resistors of the loop filter. Thus, it is desirable to design a CTDSM that has a reduced power consumption without compromising performance.

SUMMARY OF THE INVENTION

The present invention provides a continuous-time delta-sigma modulator having a single operational transconductance amplifier (OTA), an integrated circuit and method therefor as described in the accompanying claims. Specific embodiments of the invention are set forth in the dependent claims. These and other aspects of the invention will be apparent from, and elucidated with reference to, the example embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
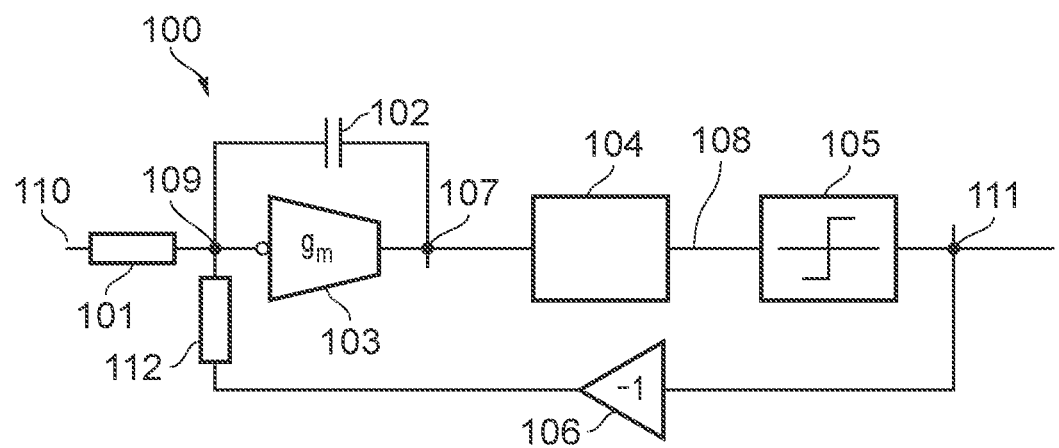
FIG. 1 illustrates a block diagram of a known continuous-time delta-sigma-modulator with active integrator.
Figure 2:
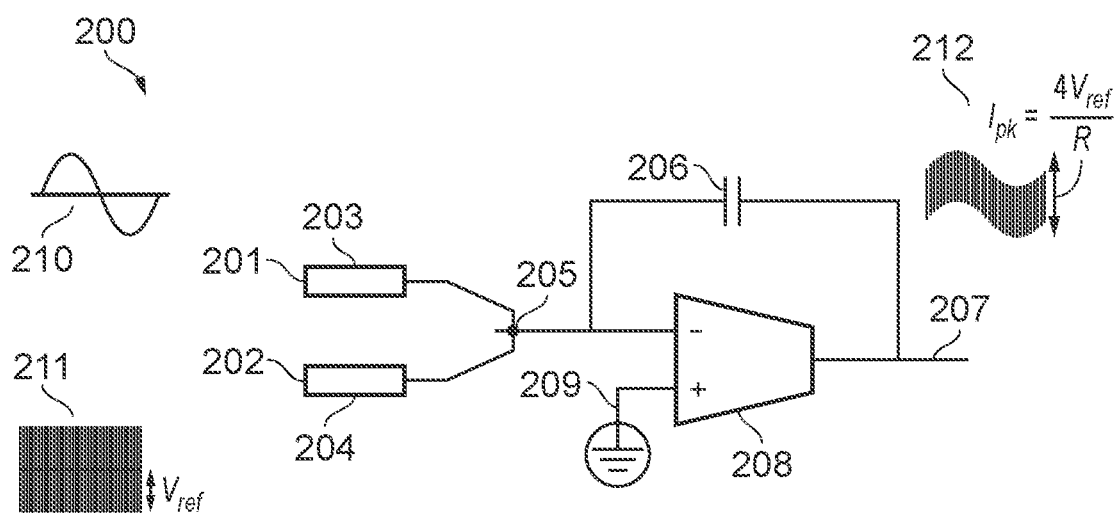
FIG. 2 illustrates a block diagram of a known input stage of the conventional CTDSM of FIG. 1.
Figure 3:
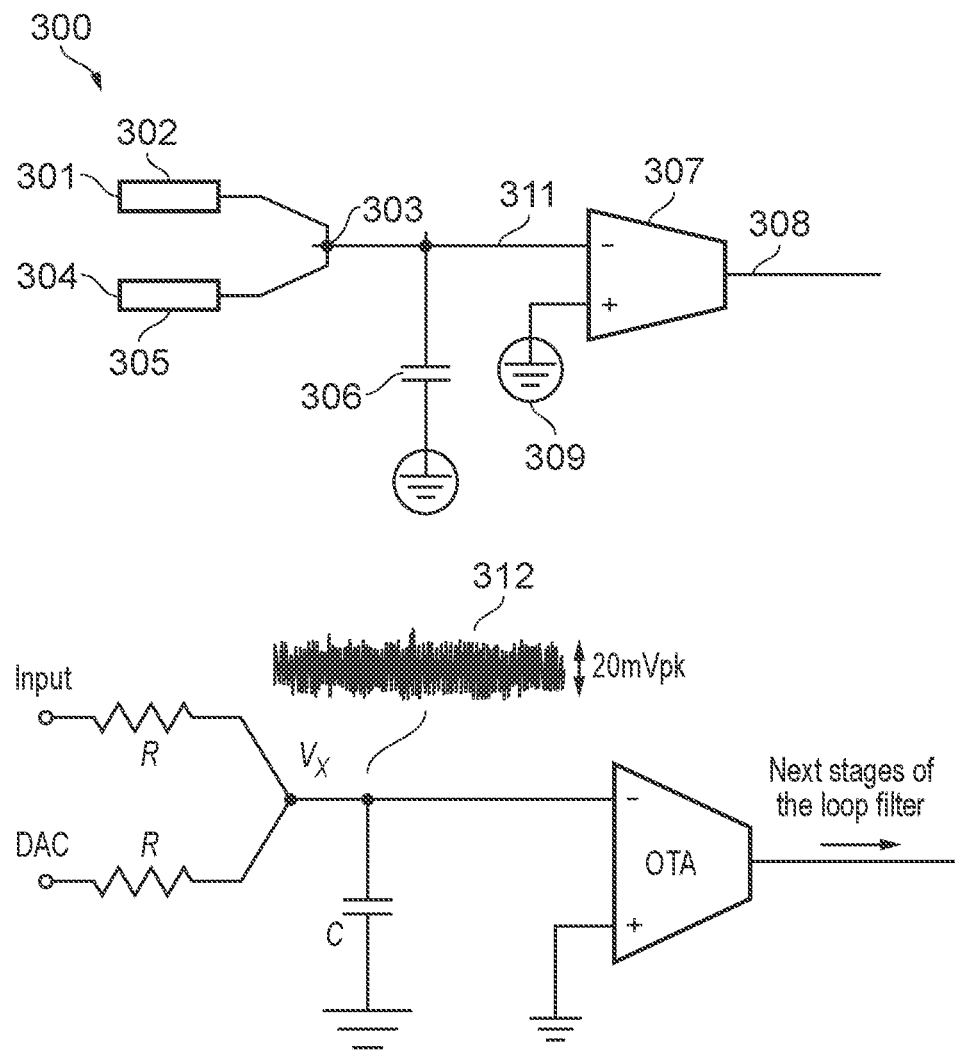
FIG. 3 illustrates a block diagram of an input stage of an alternative known CTDSM utilising a passive RC filter.

Because the illustrated embodiments of the present invention may, for the most part, be implemented using electronic components and circuits known to those skilled in the art, details will not be explained in any greater extent than that considered necessary to understand and appreciate the underlying concepts of the present invention and, in order not to obfuscate or distract from the teachings of the present invention.

In some examples, a continuous-time delta-sigma modulator (CTDSM) is configured to accept an analog signal, with the CTDSM realised by a single operational transconductance amplifier (OTA) as part of a loop filter and configured to produce a second order transfer function with two poles and one zero. A capacitor is connected between the input and output port of the OTA that creates a positive feedback-feedforward path between the input and the output port of the OTA, producing a 'zero'. Furthermore, said positive feedback path between the input and output port of the OTA modifies the input impedance at the input port of the OTA, which changes the location of the system poles and allows a generation of complex-conjugate poles located at a frequency within the designed signal bandwidth.

Some examples of the invention describe a single-OTA CTDSM with two complex-conjugate 'poles' and one 'zero' in its loop filter transfer function, which generate an optimal noise transfer function (NTF) that provides a maximum signal-to-quantisation noise ratio (SQNR) for a given oversampling ratio (OSR). In this manner a single OTA CTDSM can be optimised, by suitable selection of passive and active components, in order to achieve a high SQNR and, hence, achieve high resolution.

Some examples of the invention describe a single-ended design of a single OTA CTDSM that is configured to utilise a second order loop-filter and a feedback-feedforward capacitor. In this manner, a single OTA CTDSM can be realised that is optimised for a single-ended input signal. A single-ended representation of a CTDSM is shown in FIGS. 1-5 in order to simplify the analysis only. It should be understood that implicitly, an equivalent fully-differential circuit can always be derived from the single-ended representation, and some examples of the concepts herein described include a fully differential design of a single OTA CTDSM to illustrate a non-trivial aspect of a fully differential implementation, for example shown in FIGS. 7 and 8. The fully differential design of a single OTA CTDSM is configured to utilise a second order loop-filter and a feedback-feedforward capacitor. In this manner a single OTA CTDSM can be realised that is optimised for a fully differential input signal. The Claims of the present invention are not limited to either a single-ended circuit implementation or a fully-differential circuit implementation, as both are equally viable as described. The analysis is valid for both circuit forms, provided that the transformation between single-ended and differential circuit is performed properly, which is well understood by those skilled in the design of electronic circuits.

A skilled artisan will appreciate that in a single-ended circuit, a port consists of one terminal and GND. In a fully-differential circuit, a port is located between two terminals with opposite polarity. Hereafter, the term 'port' is intended to encompass at least this definition for single-ended circuit implementations and fully-differential circuit implementations.

Some examples of the invention describe an addition of two resistances, one in series with the feedback-feedforward capacitor and one in series with the output filter capacitor. In this manner, a transfer function of the loop filter can be modified such that the one-to-one dependence between the feedback-feedforward capacitor, the OTA transconductance and the frequency of the zero can be broken, thereby allowing these values to be varied independently of each other whilst still maintaining the required pole and zero placement.

Although some examples of the invention are described with reference to a single OTA CTDSM with a second order loop filter, it is envisaged that some examples of the invention are equally applicable to implementations that utilise, say, loop filters of order three or higher possibly using more than one OTA. A loop filter of order N will have N poles and N−1 zeros. In some examples, it is envisaged that an increase in the number of poles of the loop filter, one or more additional integrator stages may be interposed between the OTA from FIG. 4 and the quantizer. In some examples, it is envisaged that these integrator stages may be realized in several ways for instance: RC-stage, Gm-C stage or Active-RC integrator, as would be understood to a skilled person. In some examples, it is envisaged that an increase in the number of zeros of the loop filter may be implemented by adding feedforward paths, for example using one or more of the following: (a) from the input to the output of the additional integrators, (b) from the DAC to the input of the additional integrators, (c) from the outputs of the additional integrators to the input of the quantizer or (d) a combination of them.

In some examples of the invention, as illustrated in FIG. 4, FIG. 5, FIG. 7 and FIG. 8, an inverting buffer is interposed between the output of the quantizer and a terminal of the feedback resistor. For ease of explanation, as would be understood by skilled circuit designers, this is just an abstract representation and does not impart any specific limitation of the concepts herein described to a particular implementation. The (so-called) inverting buffer is solely used to convey that the polarities should be chosen in such a way that the feedback along the (outer) CTDSM loop should be negative feedback. The sign of the feedback can be changed, as would be understood to skilled circuit designers, in many ways. For example, in a single-ended circuit, the inversion may be realized by adding an inverting buffer in any point of the closed loop (not necessarily after the quantizer). In a fully-differential circuit for example, the inversion may be realized by adding inverting buffers in any point of the closed loop, or by interchanging (cross-coupling) the inverting and non-inverting terminals of two adjacent components, or a combination of the two.

Figure 4:
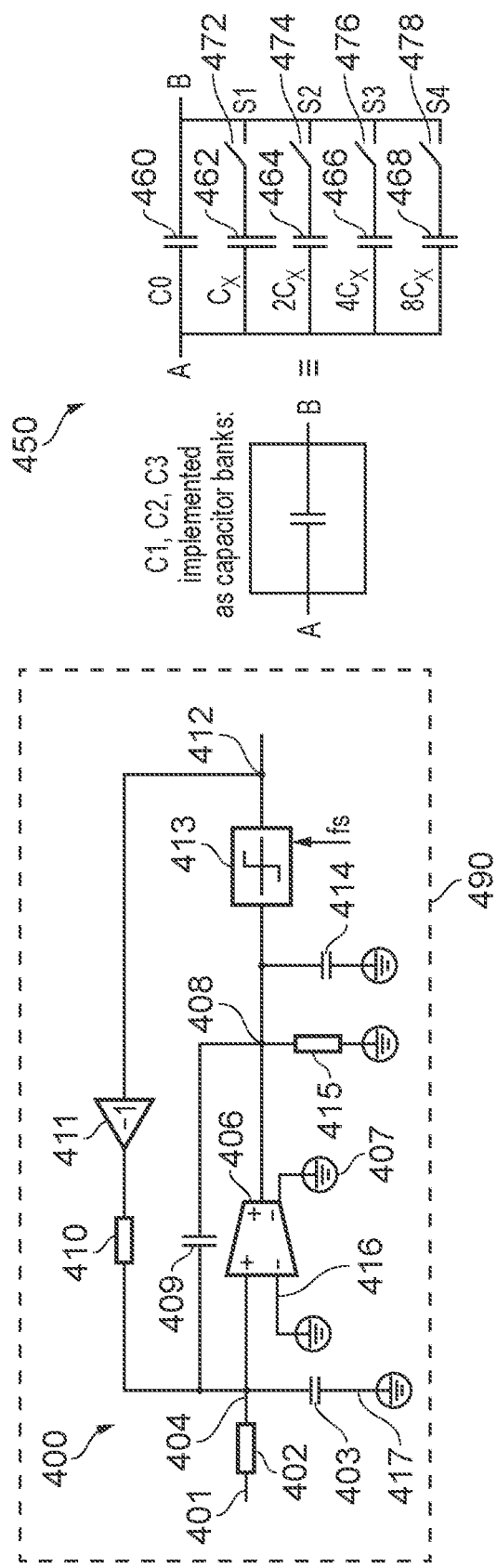
FIG. 4 illustrates an example block diagram of a single-ended CTDSM, with a novel loop filter topology capable of realizing complex-conjugated poles, according to some examples of the invention.

Referring now to FIG. 4, an example block diagram of a single-ended CTDSM circuit 400 (which can function as an ADC) with a feedback capacitor is illustrated according to some examples of the invention. The example single-ended CTDSM circuit 400 shows an analog signal at input 401 connected to the input port 404 of an OTA 406 via input resistor (R1) 402. The input port 404 is also connected to a first shunt capacitor (C1) 403 connected to ground potential 417. The output port 408 of the OTA 406 is connected to shunt resistor (R2) 415 and a second shunt capacitor (C2) 414 connected in parallel. The output port 408 of the OTA 406 is also connected to the input port of the quantizer 413.

The output 412 of the quantizer 413 is inverted 411 and connected to the input port 404 of the OTA 406 via a feedback resistor (Rdac) 410. A third capacitor (C3) 409 is connected between the input port 404 and the output port 408 of the OTA 406 realizing positive feedback around the OTA 406.

To simplify the analysis let us assume that third capacitor 409 is replaced with an open circuit. Due to the negative feedback around the loop, a current that is proportional to a difference between the voltage at input 401 and the quantized voltage 412 is drawn from the first shunt capacitor 403. Now the lowpass filter that is formed by first shunt capacitor (C1) 403 and the parallel combination of input resistor (R1) 402 and feedback resistor (Rdac) 410 attenuates high-frequency quantisation noise and creates a first pole of a loop filter. This voltage across the terminals of first shunt capacitor (C1) 403 is amplified by the Gm stage (also known as operational transconductance amplifier, or OTA 406) and converted to a current that is inserted into shunt resistor (R2) 415 and second shunt capacitor (C2) 414, which act again as a lowpass filter, thereby creating a second pole of the loop filter. To complete the analysis, let us assume that third capacitor (C3) 409 is re-inserted between the input and output port of the OTA, which has two effects:

(i) a first effect is that third capacitor (C3) 409 creates a positive feed-forward path between the first shunt capacitor (C1) 403 and second shunt capacitor (C2) 414, which results in adding a part of the $1^{st}$ order filtered signal from first shunt capacitor (C1) 403 into the $2^{nd}$ order filtered signal on second shunt capacitor (C2) 414. The result is that at the filter output 408, there is a combination of $1^{st}$ order and $2^{nd}$ order filtered signals with the same polarity. At high frequencies, third capacitor (C3) 409 has a very low impedance and can be approximated by a short circuit, hence the $1^{st}$ order filtered signal dominates at the output. Conversely, the third capacitor (C3) 409 introduces a zero into the loop filter frequency response, which ensures the stability of the delta-sigma modulator. An added benefit of this third capacitor (C3) 409 is that it provides 20 dB/dec roll-off at high frequencies regardless of any parasitic poles or limited bandwidth of the OTA, revealing that this circuit can also be applied for designing high-bandwidth ADCs.

(ii) a second important effect in the design is that third capacitor (C3) 409 creates a positive feedback path around (i.e., between the input and output port of) the OTA 406, which may be considered as 'inner positive feedback'. This is a primary reason as to why FIG. 4, FIG. 5, FIG. 7 and FIG. 8 are illustrated using a symbol of a fully-differential OTA with some of the terminals grounded, with third capacitor (C3) 409 employed in each figure to perform the positive feedback path around the respective OTA. This positive feedback changes the apparent impedance at the input port of the OTA, which changes the location of the poles of the transfer function. At a specific frequency, the apparent impedance looking into the input port of the OTA cancels with the impedance of first shunt capacitor (C1) 403 and the parallel combination of input resistor (R1) 402 and feedback resistor (Rdac) 410, making the poles complex conjugate. By correctly choosing the component values the poles can be made complex conjugate and located at a frequency lower than the signal bandwidth.

In this manner, a single-ended CTDSM circuit 400 implements a second order loop filter that uses only one OTA 406 that achieves the dual aims of low power consumption and high resolution.

Some examples of the invention further describe an approach whereby the input resistor 402 and feedback resistor 410 are not trimmed in order to maintain their linearity, whilst output resistance 415 and the OTA 406 transconductance gm are trimmed and capacitors (C1) 403, (C3) 409, (C2) 414 may be implemented as capacitor banks 450. With a capacitor bank arrangement, the first capacitor (C1) 403, third capacitor (C3) 409 and/or second shunt capacitor (C2) 414 a base capacitor Co 460 may be supplemented with one or more further capacitors in parallel 462, 464, 466, 468, often configured in multiples of twice the previous capacitor value, with each further capacitor in parallel being switchable in to supplement the value of the base capacitor Co 460 via respective switches 472, 474, 476, 478 in order to keep the values of the first capacitor (C1) 403, third capacitor (C3) 409 and/or second shunt capacitor (C2) 414 close to a nominal value. In this manner, it is possible to preserve a performance of the CTDSM across a majority or all practically working conditions.

In the following section, some guidance is provided on example values of circuit components that can be used in FIG. 4, particularly components of the loop filter in order to achieve a functional design, and thereby extrapolated to the other exemplary figures (FIG. 5, FIG. 7 and FIG. 8) that describe example circuit implementations. Of course, it is envisaged that the example topologies of the circuits shown in FIG. 4, FIG. 5, FIG. 7 and FIG. 8 can be adapted and used with other component values, which are encompassed within the claimed concepts herein described.

Examples of the invention describe a realisation of the single OTA DSM where the value of first shunt capacitor (C1) 403 is typically ten times a value of second shunt capacitor (C2) 414. In this manner it is possible to optimise the silicon areas required for realising these components.

Referring again to FIG. 4 the two complex-conjugate poles, formed by the correct choice of resistance and capacitance values, and the presence of the feedback-feedforward third capacitor (C3) 409 in combination with the 'zero', combine to achieve an optimal Noise Transfer Function (NTF) that gives the maximum 'signal-to-noise ratio' (SNR) for a given oversampling ratio (OSR).

The circuit of FIG. 4 represents a CTDSM. Its loop filter can be analysed by shorting the voltage at input 401 to ground and deriving the transfer function from the output of the DAC 411 to the input if the quantizer 413. Assuming for simplicity purposes only that $R1=R_{DAC}$, and therefore that the input of the SDM 401 to the input of the quantizer 413 path has the same gain as the output of the DAC 411 to the input of the quantizer 413 path, the loop filter transfer function in the s-domain H(s) is shown in Eq. [1]., where the values of the coefficients 'a' and 'b' are given in Eq. [2] and Eq. [3] respectively.

$$H(s) = \frac{V_Y(s)}{V_{DAC}(s)} = \frac{g_m R_2 \left(1 + \frac{C_3}{g_m}s\right)}{as^2 + bs + 2} \quad \text{Eq. [1]}$$

$$a = (C_1 C_2 + C_1 C_3 + C_2 C_3) R_1 R_2 \quad \text{Eq. [2]}$$

$$b = (C_1 + C_3) R_1 + 2(C_2 + C_3) R_2 - C_3 g_m R_1 R_2 \quad \text{Eq. [3]}$$

It is envisaged that in other example embodiments, and without assuming that the R1=Rdac, other transfer functions can be obtained, as will be readily appreciated by a skilled artisan. Thus, examples herein described are not restricted to a circuit or circuit analysis where R1=Rdac.

In the circuit of FIG. 4, the capacitor components C1 403, C2 414, C3 409, and the resistive components R1 402, R2 415, Rdac 410 and transconductance gm are as previously defined with gm being the transconductance of the OTA 406. In some examples values of second shunt capacitor (C2) 414 and third capacitor (C3) 409 may be of the same order of magnitude. In some examples, values of input resistor (R1) 402 and feedback resistor (Rdac) 410 may be kept as small as possible in order to reduce thermal noise and a value of shunt resistor (R2) 415 may generally be in a range of 100 times a value of input resistor (R1) 402. In this example, with shunt resistor (R2) 415 may generally be in a range of 100 times a value of input resistor (R1) 402 it may be possible to decrease the frequency of the notch without increasing the value (and size) of other resistors or capacitors.

The swing at the input of the OTA 406 may be designed to be kept low in order to maintain linearity. The swing at the input of the OTA 406 is caused by the quantization noise, filtered by the transfer function from the DAC 411 to the input 404 of the OTA 406:

$$\frac{V_x(s)}{V_{DAC}(s)} = \frac{1 + R_2(C_2 + C_3)s}{as^2 + bs + 2} \quad [\text{Eq. 4}]$$

where 'a' and 'b' are as given in Eq. 2 and Eq.3.

Due to the noise shaping, the quantization noise of the quantizer has most of its power concentrated at high frequencies. In order to reduce the swing at the input of the OTA 406, in some examples, the transfer function from [Eq. 4] needs to attenuate high frequencies. In order to attenuate high frequencies, the product R2(C2+C3) from Eq. 4 should be kept low. As we have seen before, R2 should be high, and as explained next, C3 may be fixed by the position of the 'zero'. Hence, C2 should be chosen to be relatively small.

In this example, the transfer function H(s) has one zero and two poles, although it is envisaged that in other examples the circuit design may include any number of 'N' poles and 'N−1' zeros, the number of poles being '1' more than the number of zeros in order to maintain stability of the DSM. The 'zero' is created by the feedforward path across third capacitor (C3) 409, which makes the transfer function roll-off at 20 dB/dec at high frequencies, thereby making the system stable in closed loop. As a rule of thumb, The angular frequency of the 'zero' is given by $\omega_z$=gm/C3 may be approximately $\omega_z$=ft/1.5 (i.e., the sampling frequency divided by 1.5) and derived by assuming a non-return-to-zero (NRZ) DAC and applying the impulse invariant approach to obtain the continuous-time equivalent of a discrete-time system, based on the empirical optimum found for discrete-time DSM, as described in the paper authored by: B. E. Boser and B. A. Wooley, and titled "The design of sigma-delta modulation analog-to-digital converters," and published in *IEEE Journal of Solid-State Circuits*, vol. 23, no. 6, pp. 1298-1308, December 1988, doi: 10.1109/4.90025.

Assuming that the poles of the transfer function of Eq. [1] are complex conjugate, then its frequency is given approximately by $1/(2\pi\sqrt{[a/2]})$, this frequency being almost independent of the transconductance of OTA 406.

Due to the appearance of the product R1*R2 in Eq.'s [2] and [3], the optimal frequency can be realized even if R1 402 is small. Advantageously, this may be realized by making R2 415 relatively large, notably without having to increase the size of the capacitors: first shunt capacitor (C1) 403, second shunt capacitor (C2) 414 and third capacitor (C3) 409.

Referring again to the single-ended CTDSM circuit 400 of FIG. 4, it is noted that the first shunt capacitor (C1) 403 will filter out high frequency quantisation noise. Advantageously, the described architecture maintains low voltage swings at both the input 404 and output 408 of the OTA 406, hence relaxing its linearity requirements and reducing power consumption. Also due to this low voltage swing, the OTA 406 is able to work with low supply voltages, in order to further reduce power whilst maintaining linearity.

In some examples, it is envisaged that the CTDSM may be implemented in integrated circuit (IC) 490 form.

Due to manufacturing variability, it is known that the capacitors on the IC 490/chip may vary between +/−20% form their intended value. Thus, in some examples of the invention, and in order to overcome this variation, it is envisaged that some examples of the invention may implement one or more additional capacitors in parallel, for example as a capacitor bank, that can be switched into or out of the circuit. The same technique can be applied to resistors. Thus, some examples of the invention further describe an approach whereby the input and feedback resistances are not trimmed in order to maintain their linearity, whilst output resistance (R2) and the OTA transconductance gm are trimmed and capacitors may be implemented as capacitor banks 450. With a capacitor bank arrangement, the first shunt capacitor 403, second shunt capacitor (C2) 414 and/or third capacitor (C3) 409 may be formed using a base capacitor Co 460, whose value may be supplemented with one or more further capacitors formed in parallel 462, 464, 466, 468 as a capacitor bank. In some examples, capacitor bank may be implemented in a weighted binary manner with successive capacitor values being configured as twice the previous capacitor value, with each parallel capacitor in the capacitor bank being switchable in via respective switches 472, 474, 476, 478, in order to supplement the value of the base capacitor Co 460 and keep the values of the first shunt capacitor 403, second shunt capacitor (C2) 414 and/or third capacitor (C3) 409 close to a nominal value. Therefore, by selecting the right combination of switched in/out capacitors, it is possible to achieve the intended total capacitance, regardless of manufacturing variations. In this manner, it is possible to preserve a performance of the CTDSM across a majority or all practically working conditions.

Figure 5:
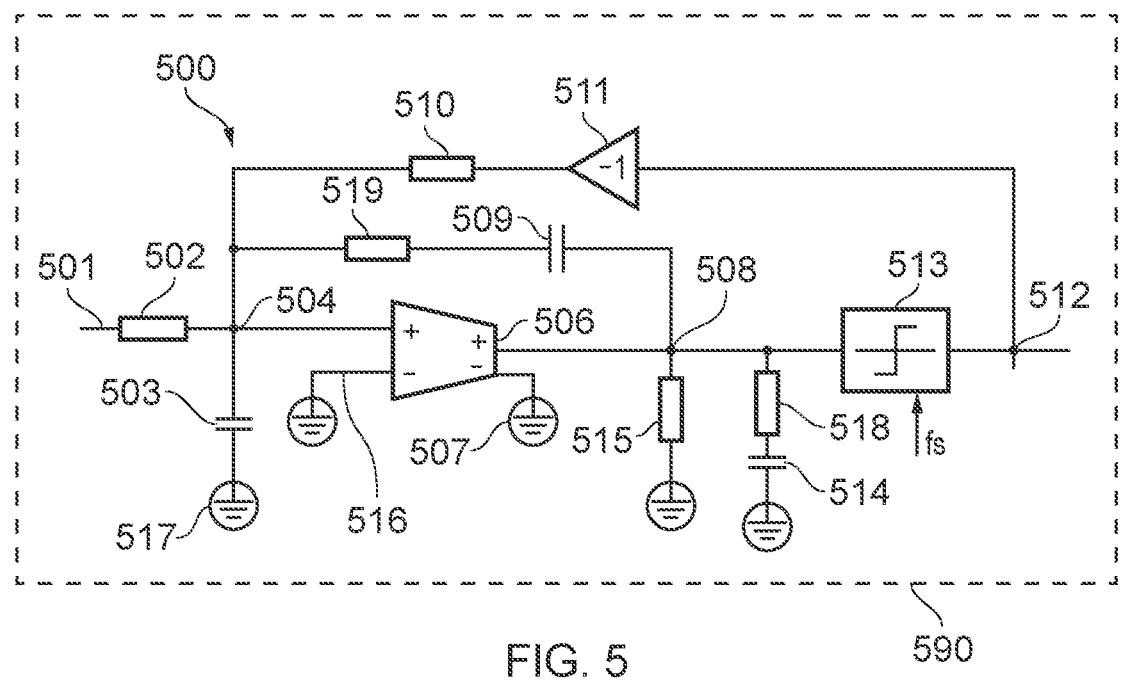
FIG. 5 illustrates an example block diagram of a single-ended CTDSM, with an alternative novel loop filter topology capable of realizing complex-conjugated poles, according to some examples of the invention.

In FIG. 4, (in the same context as in FIG. 5, FIG. 7 and FIG. 8), an OTA 406 with a differential-input and a differential-output (also known as fully-differential OTA) is illustrated. A positive voltage applied to the noninverting (+) input with respect to the inverting (−) input results in a positive current being 'sourced' by the noninverting (+) output and a positive current of the same value being 'sinked' by the negative (−) output of the OTA. When any of these terminals is connected to GND (as illustrated in FIG. 4 and FIG. 5), this symbolizes that the terminal is unused, and it should be interpreted as an abstraction, i.e., the physical connection to GND may not be needed in the real circuit, depending on the particular implementation of the OTA 406. Thus, in this manner, the herein described figures of a fully-differential OTA do not restrict the claimed concept to a particular realisation of the OTA, but are included to provide an unambiguous representation of the polarities of the input voltage and output current for any possible realisation of the OTA, as is well understood by circuit designers.

FIG. 5 illustrates an example block diagram of a further single ended CTDSM, according to some examples of the invention. The example single-ended CTDSM 500 shows an analog input signal 501 connected to the input port 504 of an OTA 506 via input resistor (R1) 502. The input port 504 is also connected to a first shunt capacitor (C1) 503 connected to ground potential 517. The output port 508 of the OTA 506 is connected to shunt resistor (R2) 515 and a series combination of resistor (RZ2) 518 and second shunt capacitor (C2) 514 connected in parallel. The output port 508 of the OTA 506 is also connected to the input of quantizer 513. The output voltage 512 of the quantizer 513 is inverted to provide negative feedback 511 and is connected to the input port 504 of the OTA 506 via a feedback resistor (Rdac) 510.

In this example, the single-ended CTDSM 500 of FIG. 5 works as follows: input resistor 502 and feedback resistor 510 form a summation at the input port 504 of the OTA 506. Due to the negative feedback 511 that is present around the closed loop, a current that is proportional to a difference between the input voltage 501 and the quantized output voltage 512 is drawn between the terminals of the first shunt capacitor 503.

The further realisation of a single OTA DSM circuit of FIG. 5 differs from the circuit of FIG. 4 by the addition of two resistances. A first resistor (Rz3) 519 is located in series with third capacitor (C3) 509 and connected between the non-inverting input port 504 and the non-inverting output port 508 of the OTA 506. A second resistor (Rz2) 518, is located in series with the output filter second shunt capacitor (C2) 514.

Referring to the transfer function of Eq. [1] it can be seen that in order to maintain the location of the zero the values of $g_m$ and third capacitor (C3) 409 in single-ended CTDSM circuit 400 of FIG. 4 should maintain a fixed ratio and hence in order to reduce the value of third capacitor (C3) 409 it would be necessary to reduce gm proportionately. However, reducing gm increases its thermal noise, which appears directly at the input of the circuit. Therefore, in this example and in order to break this trade-off, two small resistances (first resistor (Rz3) 519 and second resistor (Rz2) 518) are added that modify the circuit and its transfer function and act as added adjustment parameters, thereby providing more flexibility in the design of the circuit. In this example, the system becomes $3^{rd}$ order. However, by optimizing the values of first resistor (Rz3) 519 and second resistor (Rz2) 518, one pole cancels with one zero, thereby providing a $2^{nd}$ order transfer function similar to that of the single-ended CTDSM circuit 400 of FIG. 4.

Again, in some examples, it is envisaged that the CTDSM may be implemented in IC 590 form. Furthermore, capacitors and/or resistors may be implemented in a switchable bank format, as shown with capacitor bank 450 of FIG. 4.

Figure 6:
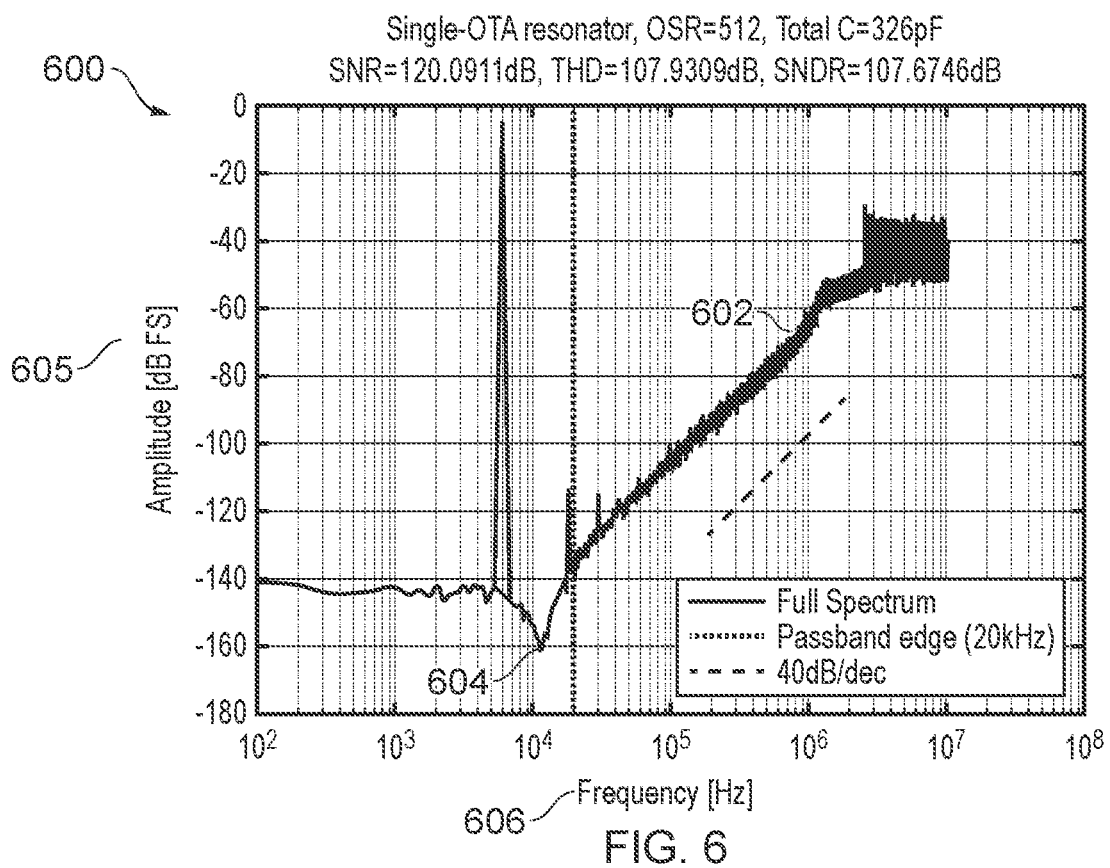
FIG. 6 illustrates an example of a power spectral density plot, showing amplitude against frequency of the bitstream obtained from a behavioural simulation of a CTDSM circuit with complex-conjugated poles in the loop filter, according to some examples of the invention.

FIG. 6 illustrates an example of a power spectral density plot 600, showing amplitude 605 against frequency 606 of a CTDSM circuit, according to some examples of the invention. These show the results of behavioural simulations of the proposed single-ended CTDSM circuit 400 of FIG. 4. The circuits have been tuned for an audio application: (100 dB SNDR, 20 kHz bandwidth) with an input test signal, e.g., the voltage at input 401 in FIG. 4, a sinusoid at a frequency f=6 kHz and amplitude=75% of full-scale. Thus, in accordance with examples of the invention, the single-ended CTDSM circuit 400 of FIG. 4 and FIG. 5 is able to show a significantly improved performance when compared to the known SDMs.

The frequencies of the poles are given by the roots of the denominator of Eq. [1], which depend on the parameters (a) and (b) defined in equations [2] and [3] respectively. In order to achieve optimal noise shaping of the input signal, the poles can be made complex, thereby providing a notch 604 in the NTF as shown in FIG. 6. This is achieved when 'b' is close to '0'. If b<0, the loop filter has Right Half-Plane (RHP) poles that cause oscillation and make the system unstable. Therefore, it is important to ensure b>0. In some examples, this can be achieved by, for example, adjusting a value of transconductance gm.

Figure 7:
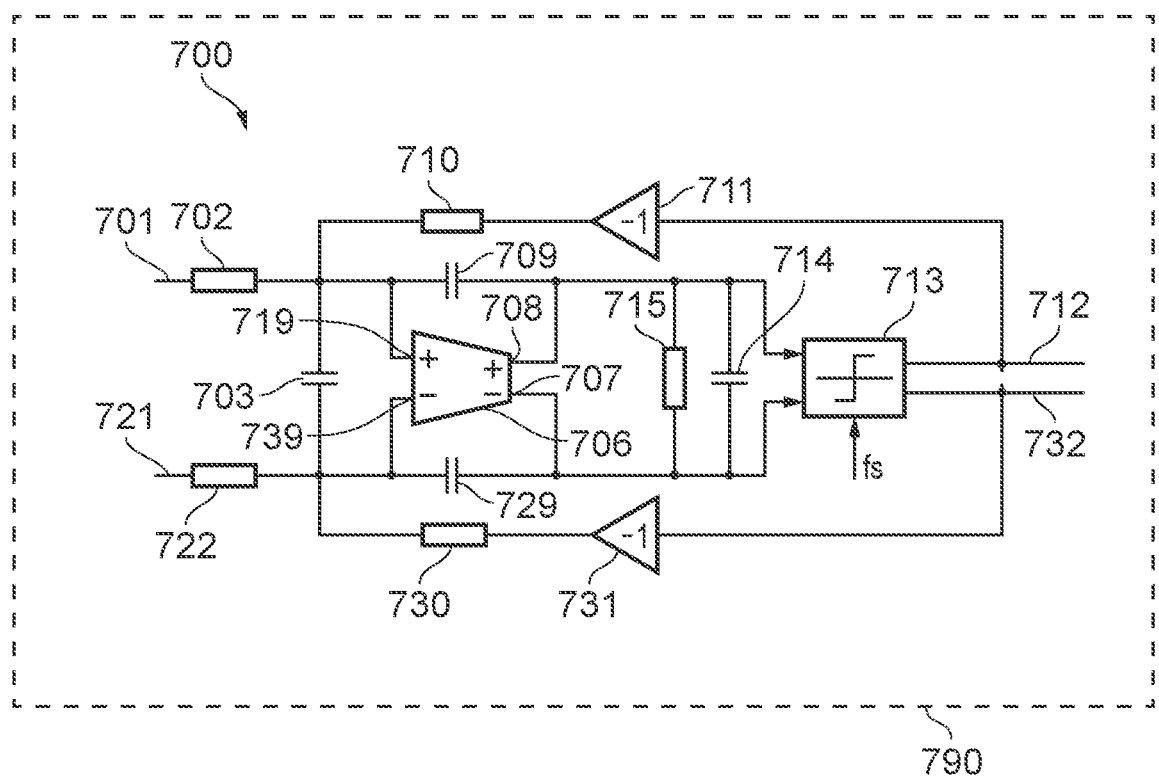
FIG. 7 illustrates a block diagram of a fully differential CTDSM circuit with a loop filter topology capable of realizing complex-conjugated poles, according to some examples of the invention.

FIG. 7 illustrates an example block diagram of a fully differential realisation alternative of the single-ended CTDSM circuit of FIG. 4, with respective positive feedback capacitors, according to some examples of the invention. The differential CTDSM 700 works in a very similar way as the single-ended CTDSM circuits 400, 500 previously described. It is well known that both circuits are equivalent and the analysis of the single-ended is the same as for the differential SDM Therefore, like components and functions will not be described in any greater detail so as not to obfuscate the description of the inventive concepts, as clearly understood by a skilled artisan. In the single-ended CTDSM circuits 400, 500, the input is applied to a single terminal and referenced to ground. In the differential, the input is instead applied to two terminals 180 degrees out of phase, and the difference between these two terminals is processed by the CTDSM. One advantage of the differential CTDSM 700 is that it is potentially more resistant to supply voltage variations.

The example fully differential CTDSM 700 shows differential analog input signal 701, 721 connected to the input port 719, 739 of OTA 706 via respective input resistors 702, 722. The differential capacitor C1 703 is connected across the terminals of the input port 719, 739 of the OTA 706. A resistor R2 715 and a capacitor C2 714 are connected in parallel across the terminals of the output port 707, 708 of the OTA 706. The output port 707, 708 of the OTA 706 is also connected to the input port of a differential quantizer 713. The differential outputs 712, 732 of differential quantizer 713 are inverted and connected to the input port 719, 739 of the OTA 706 via respective feedback resistors (Rdac) 730, 710 and inverted 711, 731. Feedback capacitors (C4) 709, (C5) 729 are connected between the input and output port of the OTA 706 realizing positive feedback around the OTA 706.

In order to achieve a fully differential realisation, the differential CTDSM 700 of FIG. 7 should be balanced. Hence, components should be added at the inverting input, but modified in value such that the circuit retains the characteristics of the single ended input version, for example single-ended CTDSM circuit 400 of FIG. 4. In order to maintain the frequency response, the component values should be modified in the following way:

(i) Feedback capacitors (C4) 709 and (C5) 729 are equal to twice the capacitance of capacitor (C3) 409 of FIG. 4;

(ii) The input resistances 702, 722 are each half the value of the input resistance 402 of FIG. 4;

(iii) The feedback resistances 710, 730 are each half of the value of the feedback resistance 410 of FIG. 4; and (iv) The remaining components C1, C2, gm, R2 from FIG. 7 shall be the same value as the respective ones from FIG. 4.

Again, in some examples, it is envisaged that the CTDSM may be implemented in IC 790 form. Furthermore, capacitors and/or resistors may be implemented in a switchable bank format, as shown with capacitor bank 450 of FIG. 4

Figure 8:
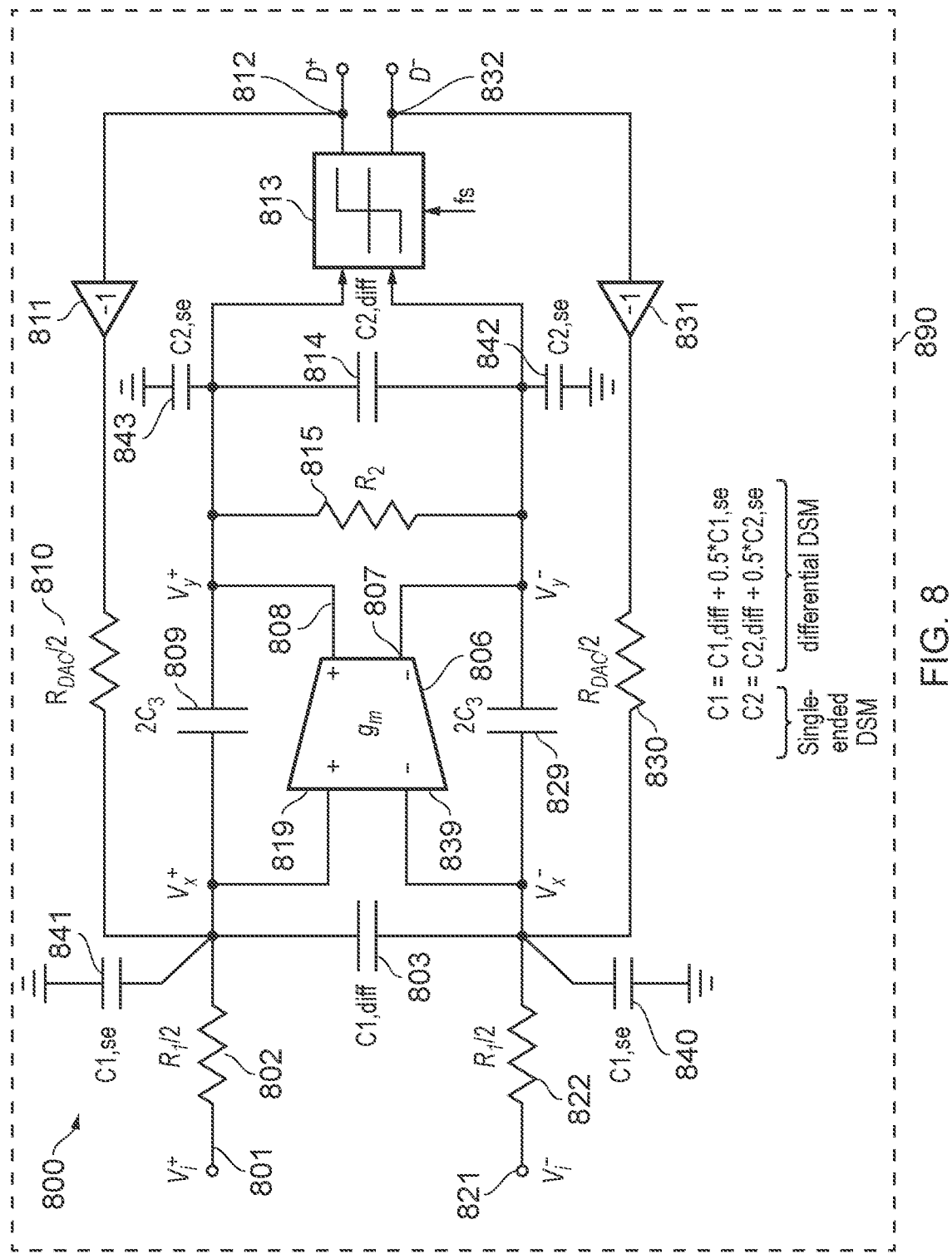
FIG. 8 illustrates a further example of a block diagram of a fully differential CTDSM circuit with a partition between differential and single-ended capacitors, according to some examples of the invention.

Referring now to FIG. 8, FIG. 8 illustrates a further example of a block diagram of a fully-differential CTDSM circuit 800 with a partition between differential and single-ended capacitors and with respective positive feedback capacitors, according to some examples of the invention. The fully-differential CTDSM 800 works in a very similar way as the fully-differential CTDSM 700 of FIG. 7. Therefore, like components and functions will not be described in any greater detail so as not to obfuscate the description of the inventive concepts, as clearly understood by a skilled artisan.

Again, in this fully-differential circuit implementation, the input signal is applied to a port with two terminals 180 degrees out of phase, and the difference between these two terminals is processed by the CTDSM. One advantage of the fully-differential CTDSM circuit 800 is that it is potentially more resistant to supply voltage variations.

The example fully differential CTDSM 800 shows differential analog input signal 801, 821 connected to the input port 819, 839 of OTA 806 via respective input resistors 802, 822. The capacitor C1 803 is connected across the terminals of the input port 819, 839 of the OTA 806. A resistor R2 815 and a capacitor C2 814 are connected in parallel across the output port 807, 808 of the OTA 806. The output port 807, 808 (having two terminals in a fully-differential implementation) of the OTA 806 is also connected to the input port of a differential quantizer 813. The differential outputs 812, 832 of differential quantizer 813 are inverted 831, 811 and connected to the input port 819, 839 of the OTA 806 via respective feedback resistors (Rdac) 830, 810. Third feedforward-feedback capacitors (2C3) 809, 829 are connected between the input port 819, 839 and output port 807, 808 of the OTA 806 realizing positive feedback around the OTA 806.

In order to achieve a fully differential realisation, the differential CTDSM 800 of FIG. 8 should be balanced. Hence, components should be added, modified in value such that the circuit retains the characteristics of the single ended input version, for example single-ended CTDSM circuit 400 of FIG. 4. In order to maintain the frequency response, the component values should be modified in the following way:
  (i) Feedforward-Feedback capacitors 2C3 809, 829 are equal to twice the capacitance of capacitor (C3) 409 of FIG. 4;
  (ii) The input resistances 802, 822 are each half the value of the input resistance 402 of FIG. 4;
  (iii) The feedback resistances 810, 830 are each half of the value of the feedback resistance 410 of FIG. 4; and
  (iv) The remaining components C1, C2, gm, R2 from FIG. 8 shall be the same value as the respective ones from FIG. 4.

Again, in some examples, it is envisaged that the CTDSM may be implemented in IC 890 form. Furthermore, capacitors and/or resistors may be implemented in a switchable bank format, as shown with capacitor bank 450 of FIG. 4.

However, in FIG. 8 and in order to improve the robustness of the circuit to interference, the capacitance value of first differential capacitor C1 (e.g., differential capacitor C1 703 in FIG. 7) can be split between a differential capacitor C1_diff 803 and two grounded capacitors C1_se 840, 841. In this manner, common-mode interferers are absorbed in part by C1_se 840, 841. Similarly, the capacitance value of second shunt capacitor C2 (e.g., second shunt capacitor C2 714 of FIG. 7) can be split between C2_diff 814 and C2_se 842, 843. In this example, an advantage is that the common-mode kickback of the quantizer 813 may be absorbed in part by C2_se 842, 843. In addition, C2_se 842, 843 also absorbs common-mode interferers that make it through third feedforward-feedback capacitors C3 809, 829 and the OTA 806, thereby making the CTDSM 800 circuit more robust. A skilled artisan recognises that the transfer function of the CTDSM 800 circuit does not change if the values of C1_diff 803, C1_se 840, 841, C2_diff 814 and C2_se 842, 843 obey the previous equations.

Again, in some examples, it is envisaged that the CTDSM may be implemented in IC 890 form. Furthermore, capacitors and/or resistors may be implemented in a switchable bank format, as shown with capacitor bank 450 of FIG. 4

Figure 9:
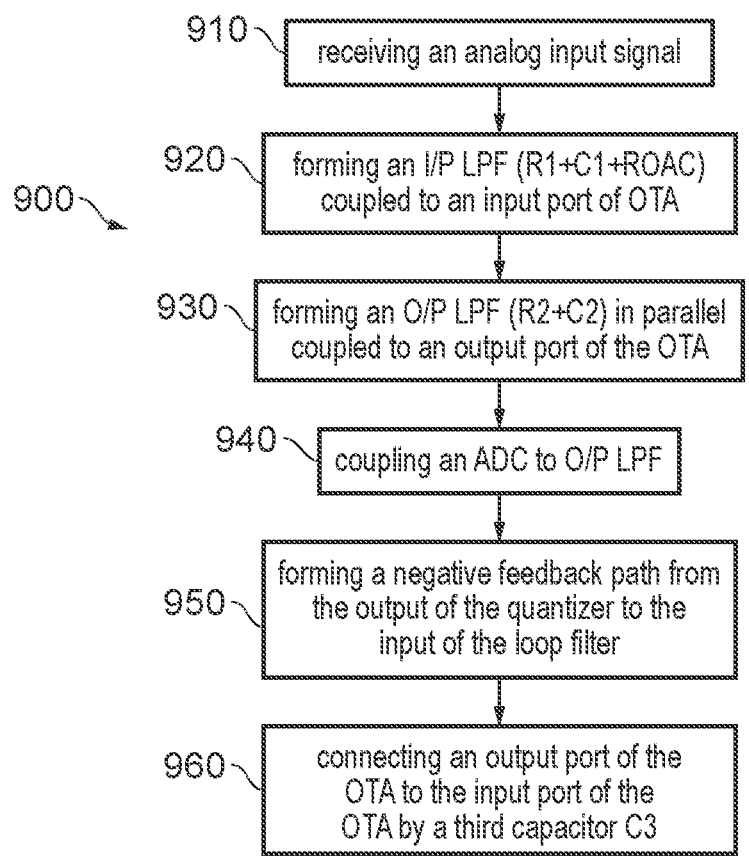
FIG. 9 illustrates a flowchart of a method of a CTDSM whose loop filter contains only one OTA and is capable of having complex-conjugated poles, according to some examples of the invention.

FIG. 9 illustrates a flowchart 900 of a method of operating a delta-sigma modulation comprising single operational transconductance amplifier (OTA), according to some examples of the invention. The flowchart 900 comprises, at 910, receiving an analog (single-ended or fully differential) input signal; at 920, forming an input low pass filter network comprising at least one input resistor, R1, (e.g., 402, 502, 702, 722, 802, 822) at least one first shunt capacitor, C1, (e.g., 403, 503, 703, 803) and at least one feedback resistor, Rdac (e.g., 410, 510, 710, 810) connected to the input port of the OTA (e.g., 406, 506, 706, 806), wherein the-analog input signal is arranged to pass through the input low pass filter. At 930 forming an output low pass filter comprising a second resistor, R2, (e.g., 415, 515, 715, 815) in parallel to a second shunt capacitor, C2, (e.g., 414, 514, 714, 814) and coupled to the output port of the OTA (e.g., 406, 506, 706, 806). At 940, the flowchart comprises coupling an a quantizer to the output low pass filter. At 950 the flowchart comprises forming a negative feedback path from the output of a quantizer of the ADC to the input of the input low pass (loop) filter. At 960, the flowchart comprises connecting the output port of the OTA (e.g., 406, 506, 706, 806) to the input port (e.g., 404, 504, 719, 739, 819, 839) of the OTA (e.g., 406, 506, 706, 806) by a third feedforward-feedback capacitor, C3 (e.g., 409, 509).

It is envisaged that in other examples, alternative circuits and components may be employed that utilise the concepts herein before described. In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality. Furthermore, those skilled in the art will recognize that boundaries between the above-described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. Also, for example, in one embodiment, the illustrated examples may be implemented as circuitry located on a single integrated circuit or within a same device. Alternatively, the examples may be implemented as any number of separate integrated circuits or separate devices interconnected with each other in a suitable manner. Also, for example, the examples, or portions thereof, may implemented as soft or code representations of physical circuitry or of logical representations convertible into physical circuitry, such as in a hardware description language of any appropriate type. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A continuous-time delta-sigma modulator, CTDSM, comprising:
    an operational transconductance amplifier (OTA) having an input port configured to receive an analog input signal and an output port;
    an input low pass filter network comprising at least one input resistor, R1, at least one first shunt capacitor, C1, and at least one feedback resistor, Rdac, each connected to the input port of the OTA;
    an output filter network comprising a shunt second resistor, R2, in parallel to a second shunt capacitor, C2, and coupled to the output port of the OTA;
    a quantizer connected to the output filter network and having an output connected to the input port of the OTA via the at least one feedback resistor, Rdac; and
    wherein the input port and the output port of the OTA are connected by a third feedforward-feedback capacitor, C3, arranged to provide a positive feedback path around the OTA.

2. The CTDSM of claim 1 where the third feedforward-feedback capacitor, C3, creates a zero of a loop filter.

3. The CTDSM of claim 2 wherein the positive feedback path around a single OTA modifies an impedance seen at the input port of the OTA.

4. The CTDSM of claim 2 configured to have an increased order of the loop filter having N poles and N–1 zeros, the CTDSM comprising:
    one or more further integrator stages interposed between the OTA and the quantizer configured to form N poles; and
    one or more additional feedforward paths configured to form N–1 zeros, wherein the one or more additional feedforward paths comprise one or more of the following:
        a feedforward path from an input to an output of the one or more further integrator stages,
        a feedforward path from a DAC to the input of the one or more further integrator stages, and
        a feedforward path from the output of the one or more further integrator stages to the input of the quantizer.

5. The CTDSM of claim 1 wherein the at least one input resistor, R1, and the at least one feedback resistor, Rdac, the first shunt capacitor C1, the OTA, the shunt second resistor R2, the second shunt capacitor C2 and the third feedforward-feedback capacitor C3 are arranged to create a filter transfer function with one zero and two poles.

6. The CTDSM of claim 5 wherein values of the third feedforward-feedback capacitor, C3, first capacitor, C1, at least one input resistor, R1, and the at least one feedback resistor, Rdac, are configured to create two complex conjugate poles.

7. The CTDSM of claim 6 wherein the two complex conjugate poles are located at a frequency within a signal bandwidth of the received analog input signal.

8. The CTDSM of claim 5 wherein a resistance value of shunt second resistor, R2, is configured to be larger than a value of the at least one input resistor, R1, and Rdac that lowers a frequency of the poles without increasing input thermal noise.

9. The CTDSM of claim 1 wherein the received analog input signal at the input port is a single ended input signal.

10. The CTDSM of claim 1 wherein the received analog input signal are received differential analog input signals connected to an input port of a single differential OTA via respective input resistors, wherein
    the input low pass filter network comprises:
        a first shunt capacitor, C1, coupled to a respective first parallel-coupled shunt resistor, R1, and first feedback resistor, Rdac, coupled to a first input port of the single OTA, and
        a second parallel-coupled shunt resistor, R1, and second feedback resistor, Rdac, coupled to a second input port of the single differential OTA,
    wherein the received differential analog input signals are arranged to pass through said input low pass filter network.

11. The CTDSM of claim 10 wherein the CTDSM further comprises:
    a differential quantizer, wherein a respective output port of the differential quantizer is fed-back to a respective input port of the single differential OTA via respective inverting buffer and respective feedback resistors, Rdac.

12. The CTDSM of claim 10 wherein the CTDSM further comprises third feedforward-feedback capacitors, C3, coupled between respective output port and respective input port of the single OTA that realize the positive feedback path around the single OTA.

13. The CTDSM of claim 10 wherein at least one of the following is configured:
  first capacitor, C1, is formed of a first differential capacitor, C1_diff, and two first grounded capacitors, C1_se, where common-mode interferers are absorbed in part by C1_se; and
  second capacitor, C2, is formed of a second differential, C2_diff, and two second grounded capacitors, C2_se, where the two second grounded capacitors, C2_se, absorb in part common-mode kickback of the quantizer and common-mode interferers that pass through third feedforward-feedback capacitors, C3, and the OTA.

14. An integrated circuit comprising a continuous-time delta-sigma modulator (CTDSM), the CTDSM comprising:
  an operational transconductance amplifier (OTA) having an input port configured to receive an analog input signal and an output port;
  an input low pass filter network comprising at least one input resistor, R1, at least one first shunt capacitor, C1, and at least one feedback resistor, Rdac, each connected to the input port of the OTA;
  an output filter network comprising a shunt second resistor, R2, in parallel to a second shunt capacitor, C2, and coupled to the output port of the OTA;
  a quantizer connected to the output filter network and having an output connected to the input port of the OTA via the at least one feedback resistor, Rdac; and
  wherein the input port and the output port of the OTA are connected by a third feedforward-feedback capacitor, C3, arranged to provide a positive feedback path around the OTA.

15. A method of delta-sigma modulation by a continuous-time delta sigma modulator (CTDSM) having a single operational transconductance amplifier (OTA) comprising input port and output port, the method comprising:
  receiving an analog input signal;
  forming an input low pass filter network comprising at least one input resistor, R1, at least one first shunt capacitor, C1, and at least one feedback resistor, Rdac, connected to the input port of the OTA, wherein the analog input signal is arranged to pass through the input low pass filter network;
  forming an output low pass filter network comprising a shunt second resistor, R2, in parallel to a second shunt capacitor, C2, and coupled to the output port of the OTA;
  coupling a quantizer to the output low pass filter network;
  forming at least one negative feedback path from an output of the quantizer to the input port of the OTA via the at least one feedback resistor, Rdac; and
  connecting the output port of the single OTA to the input port of the single OTA by a third feedforward-feedback capacitor, C3;
  wherein the input port and the output port of the OTA are connected by the third feedforward-feedback capacitor, C3, arranged to provide a positive feedback path around the OTA.

16. The method of delta-sigma modulation of claim 15 further comprising creating a filter transfer function with one zero and two poles using the at least one input resistor, R1, the at least one feedback resistor, Rdac, the first shunt capacitor, C1, the OTA, the shunt second resistor, R2, the second shunt capacitor, C2, and the third feedforward-feedback capacitor, C3.

17. The method of delta-sigma modulation of claim 16 wherein values of the third feedforward-feedback capacitor, C3, first capacitor, C1, at least one input resistor, R1, and the at least one feedback resistor, Rdac, are configured to create two complex conjugate poles.

18. The method of delta-sigma modulation of claim 16 configured to have an increased order of the loop filter having N poles and N−1 zeros, the method further comprising:
  Interposing one or more further integrator stages between the OTA and the quantizer configured to form N poles; and
  configuring one or more additional feedforward paths to form N−1 zeros, wherein the one or more additional feedforward paths comprise one or more of the following:
    a feedforward path from an input to an output of the one or more further integrator stages,
    a feedforward path from a DAC to the input of the one or more further integrator stages, and
    a feedforward path from the output of the one or more further integrator stages to the input of the quantizer.

19. The method of delta-sigma modulation of claim 15 wherein the received analog input signal are received differential analog input signals connected to input port of a single differential OTA via respective input resistors, the method further comprising:
  forming the input low pass filter network by:
    coupling a first shunt capacitor, C1, to a respective first parallel-coupled shunt resistor, R1,
    coupling a first feedback resistor, Rdac to a first output port of the single OTA,
    coupling a second parallel-coupled shunt resistor, R1, and second feedback resistor, Rdac to a second output port of the single OTA,
  wherein the received differential analog input signals are arranged to pass through said input low pass filter network.

20. The method of delta-sigma modulation of claim 19 wherein the CTDSM further comprises a differential quantizer, the method further comprising: feeding back a respective output port of the differential quantizer to a respective input port of the single differential OTA via respective inverting buffer and respective feedback resistors, Rdac.

* * * * *